US008829892B2

(12) United States Patent
Kalmbach et al.

(10) Patent No.: US 8,829,892 B2
(45) Date of Patent: Sep. 9, 2014

(54) RELAY, IN PARTICULAR FOR THE HIGH-CURRENT RANGE

(75) Inventors: Simon Kalmbach, Altensteig (DE); Roland Hengstler, Rottenburg (DE); Werner Kern, Neubulach (DE); Uwe Grindemann, Neubulach (DE)

(73) Assignee: Kissling Elektrotechnik GmbH, Wildberg (DE)

( * ) Notice: Subject to any disclaimer, the term of this patent is extended or adjusted under 35 U.S.C. 154(b) by 422 days.

(21) Appl. No.: 13/093,219

(22) Filed: Apr. 25, 2011

(65) Prior Publication Data

US 2011/0267034 A1 Nov. 3, 2011

(30) Foreign Application Priority Data

Apr. 29, 2010 (DE) .......................... 10 2010 018 739

(51) Int. Cl.
*G01R 15/20* (2006.01)

(52) U.S. Cl.
USPC ..................................................... 324/117 H

(58) Field of Classification Search
CPC ...... G01R 15/20; G01R 15/202; G01R 33/07; H01H 47/002
USPC ........................................................ 324/117
See application file for complete search history.

(56) References Cited

U.S. PATENT DOCUMENTS

| 5,744,923 | A | * | 4/1998 | Strauss et al. ................. 318/563 |
| 6,252,389 | B1 | | 6/2001 | Baba et al. |
| 8,446,046 | B2 | * | 5/2013 | Fells et al. ..................... 307/104 |
| 2004/0240140 | A1 | | 12/2004 | Maller et al. |
| 2013/0049751 | A1 | * | 2/2013 | Hamberger et al. .......... 324/253 |

FOREIGN PATENT DOCUMENTS

| DE | 297 24 595 | 5/2002 |
| EP | 0 190 717 | 8/1986 |
| EP | 1 037 240 | 9/2000 |
| EP | 1 353 348 | 10/2003 |
| EP | 2 019 454 | 1/2009 |
| WO | 90/11529 | 10/1990 |
| WO | 99/36928 | 7/1999 |
| WO | 01/86680 | 11/2001 |

OTHER PUBLICATIONS

Hall Effect, from Wikipedia, p. 1-10.*
Sauer: RE,AIS-Lexicon Relay Dictionary) 2-nd Edition, Heidelberg: Huethig, 1985, pp. 35, 55, 214-219, 302, ISBN 3-7785-0943.

* cited by examiner

*Primary Examiner* — Thomas F Valone
(74) *Attorney, Agent, or Firm* — Michael J. Striker

(57) ABSTRACT

A relay, in particular for high-current operation, having at least one coil and a movable armature which by the magnetic flux generated in the at least one coil permits or interrupts a current flow via two main contact terminals and having a current-measuring instrument for measuring at least one current flowing via the main contact terminals by at least one Hall sensor has a device around the main contacts for aligning the magnetic flux with the Hall sensor or sensors.

7 Claims, 3 Drawing Sheets

RELAY, IN PARTICULAR FOR THE HIGH-CURRENT RANGE

CROSS-REFERENCE TO RELATED APPLICATION

The invention described and claimed hereinbelow is also described in German Patent Application DE 10 2010 018 739.9 filed on Apr. 29, 2010. This German Patent Application, whose subject matter is incorporated here by reference, provides the basis for a claim of priority of invention under 35 U.S.C. 119(a)-(d).

Patent application Ser. No. 13/093,178 filed on Apr. 26, 2011 and claiming priority from German Patent Application DE 10 2010 018 738.0 filed on Apr. 29, 2010 and application Ser. No. 13/093,257 filed on Apr. 25, 2011 and claiming priority from German patent application DE 10 2010 018 755.0 filed on Apr. 29, 2010 can include a subject matter which is similar to the subject matter of the present application.

BACKGROUND OF THE INVENTION

The invention relates to a relay, in particular for the high-current range, having at least one coil and a movable armature, which by means of the magnetic flux that can be generated in the at least one coil permits or interrupts a current flow via two main contact terminals, and having a current-measuring instrument for measuring at least the current, flowing via the main contact terminals, by means of at least one Hall sensor.

Particularly in the high-current range, relays often have a current- and measuring instrument, to enable detecting the current flowing via the main contact terminals. To that end, Hall sensors are used as a rule, as to measure the flowing currents not directly but indirectly, or in other words to enable detecting them galvanically separately, via the magnetic field induced by the current. However, the magnetic field is induced not only at the Hall sensor but at the entire relay. Because of the remanence effects in the relay, this magnetization can lead to mistakes in the current measurement. If the current direction in a magnetized relay of this kind is reversed, then the magnetic field generated by the current flow is attenuated by the magnetic field of the premagnetized relay. This is interpreted by the Hall sensor as an overly low current. The measurement precision of the Hall sensor or sensors is impaired considerably as a result.

SUMMARY OF THE INVENTION

By comparison, the object of the invention is to furnish a current-measuring instrument for a relay, with which a current flowing via the main contact terminals can be measured precisely.

This object is attained according to the invention by a relay of the type recited at the outset, in which a device for aligning the magnetic flux with the Hall sensor or sensors is provided around the main contact terminals.

By means of the device for aligning the magnetic flux, the magnetic flux is concentrated at the Hall sensor or sensors. Thus the influence of other magnetized regions of the relay is lessened, and as a result the measurement precision of the current-measuring instrument can be increased considerably. To enable covering a relatively large three-dimensional area for current measurement, a plurality of Hall sensors can be used.

In a preferred exemplary embodiment of the invention, the device for aligning the magnetic flux can have at least one ferromagnetic body that surrounds the main contact terminals and is provided with a free space for the Hall sensor or sensors. In the ferromagnetic body, a strong magnetic field is induced by the current flowing through the main contact terminals. In a free space (air gap) of the ferromagnetic body, in which the Hall sensor or sensors are located, the induced magnetic field is especially strong, so that the current-measuring instrument can have very high precision.

Preferably, two ferromagnetic bodies can be provided, which each embrace one main contact terminal and each have one free space in which a Hall sensor is located. If very high currents are to be switched with the relay, then it is advantageous to provide two main contact terminals, spaced apart three-dimensionally from one another, each with their own ferromagnetic bodies. The Hall sensors associated with the respective main contact terminals can be located such that one Hall sensor detects the magnetic field of the inflowing current, and another Hall sensor detects the magnetic field of the current flowing out of the relay. Unwanted leak flows in the relay can be ascertained by a comparison of the two currents.

In a further exemplary embodiment of the invention, the current-measuring instrument of the relay can be embodied such that the ferromagnetic body annularly embraces both main contacts, and between the main contacts, in an inner free space, there is at least one Hall sensor. Here the two main contacts are located parallel and side by side. In the free space of the ferromagnetic body, one or more Hall sensors may be located, in order to measure currents flowing into and out of the relay.

In a further feature of the invention, the ferromagnetic body or bodies are formed of a stack of ferromagnetic metal sheets. By splitting up the ferromagnetic body into a bundle of individual metal sheets, the remanence of the ferromagnetic body can be reduced markedly. As a material for the sheet-metal stack, a magnetic sheet steel provided with a finish can be used. The use of a stack of ferromagnetic metal sheets thus ensures not only focusing of the magnetic flux but also a reduction in the remanence. The measurement precision of the current-measuring instrument of the relay can be increased still further as a result.

Moreover, with the current-measuring instrument, currents flowing via the main contacts can preferably be measurable in both current directions. As a result, the usage possibilities of the relay can be expanded substantially.

In a further exemplary embodiment of the invention, the current-measuring instrument can have a microcontroller, with which currents measured by the Hall sensor or sensors can be detected and further processed. By the use of the microcontroller, an automatic shutoff of the relay in the event of excess current can be achieved. Thus via the microcontroller, a safety shutoff of the relay can be tripped. For that purpose, freely programmable excess current shutoff thresholds can for instance be stored in memory in the microcontroller. Moreover, by means of the microcontroller, a characteristic curve of a conventional one-way fuse can be simulated.

The microcontroller furthermore offers the possibility of using a simulation of a characteristic curve of a conventional safety fuse as a tripping characteristic. In that case, the microcontroller evaluates the signal measured by the current-measuring instrument and, by a comparison with the safety fuse characteristic curve stored in memory, it can detect damage to a component in the current circuit and interrupt the current circuit in the relay.

A further advantage of the microcontroller is the possibility of switching the relay on and off via a control input. Also by means of the microcontroller, an undervoltage shutoff threshold and an overtemperature shutoff as well as the outputting of a status signal to indicate the operating state can be achieved. Also at the microcontroller, it is also possible for a minimal supply voltage to be specified. The microcontroller can then be programmed such that the relay cannot be switched on if this supply voltage fails to be attained, for instance so that a weak battery is not further burdened by an electrical consumer that can be connected in via the relay. Finally, by means of the microcontroller, brief current peaks can be precluded from influencing the outcome of measurement. Thus incorrect interpretations of the outcomes of measurement caused by switch-on current peaks can for instance be avoided, because the microcontroller blanks out the current-measuring instrument for a variable length of time after the switch-on point. Operating current peaks can also be detected and "blanked out" by the microcontroller.

Preferably, the currents measured via the Hall sensor or sensors can be converted from analog to digital via the microcontroller. As a result, the microcontroller offers further possibilities for processing the measured current. The measured current can for instance be converted digitally and further processed. The measurement precision of the current-measuring instrument is preserved unchanged.

The relay of the invention can be used wherever the relay serves as a fuse or currents are to be measured and output.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
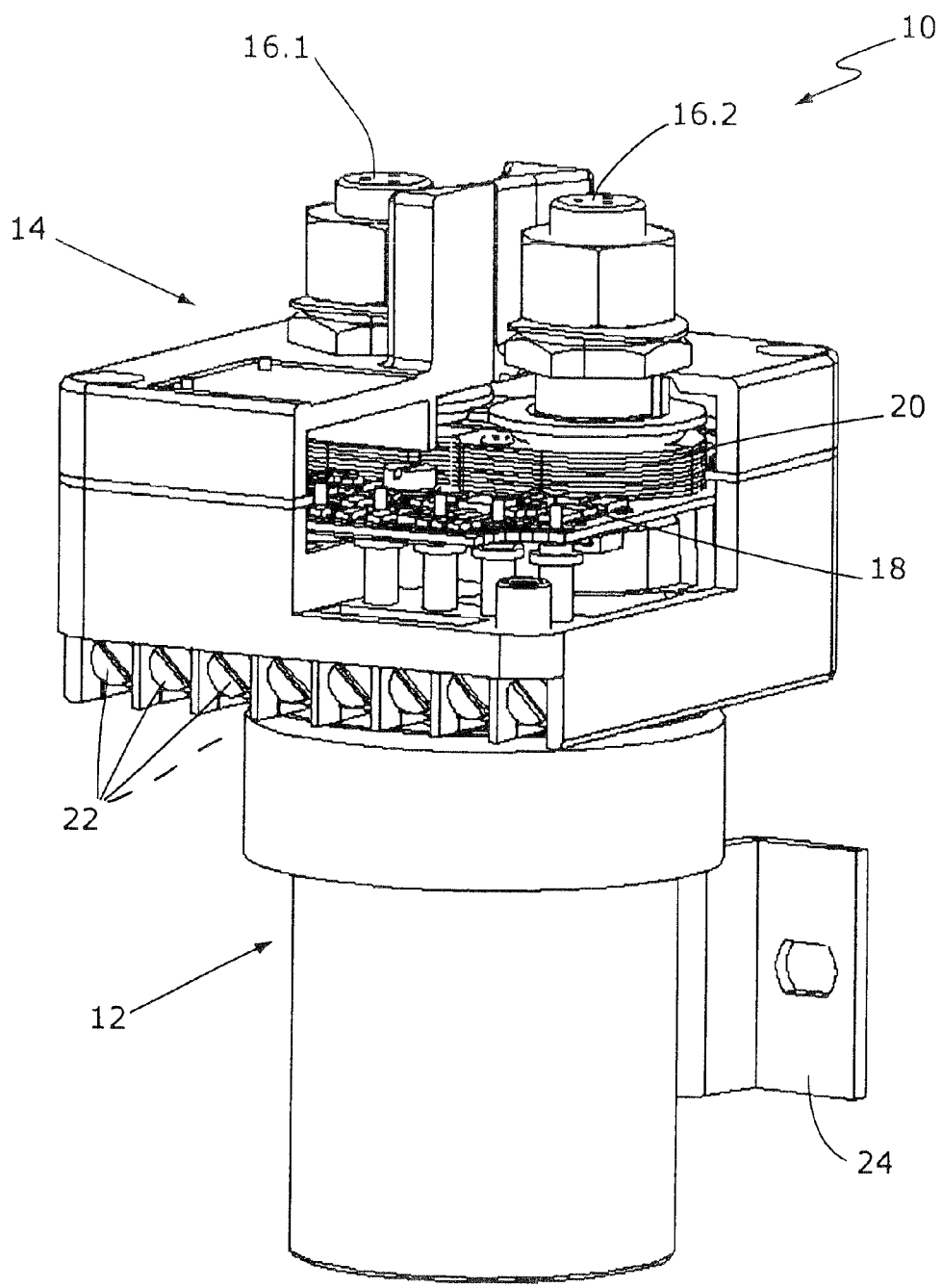
FIG. 1, a perspective view, partly in section, of a first exemplary embodiment of the invention.

FIG. 1 shows a first exemplary embodiment of a relay 10 according to the invention, which includes a base body 12 and a connection unit 14. The connection unit 14 has two main contact terminals 16.1, 16.2. The main contact terminals 16.1, 16.2 can be connected electrically by a main contact bridge (not shown) by means of a switching operation in the relay. Besides the main contact terminals 16.1, 16.2, the connection unit 14 has a current-measuring instrument, which includes a microcontroller 18 and a device 20 for aligning the magnetic flux. The connection unit 14 furthermore has control contacts 22 for controlling the relay 10. Via a side flange 24, the relay 10 can be secured, for instance in a vehicle.

Figure 2:
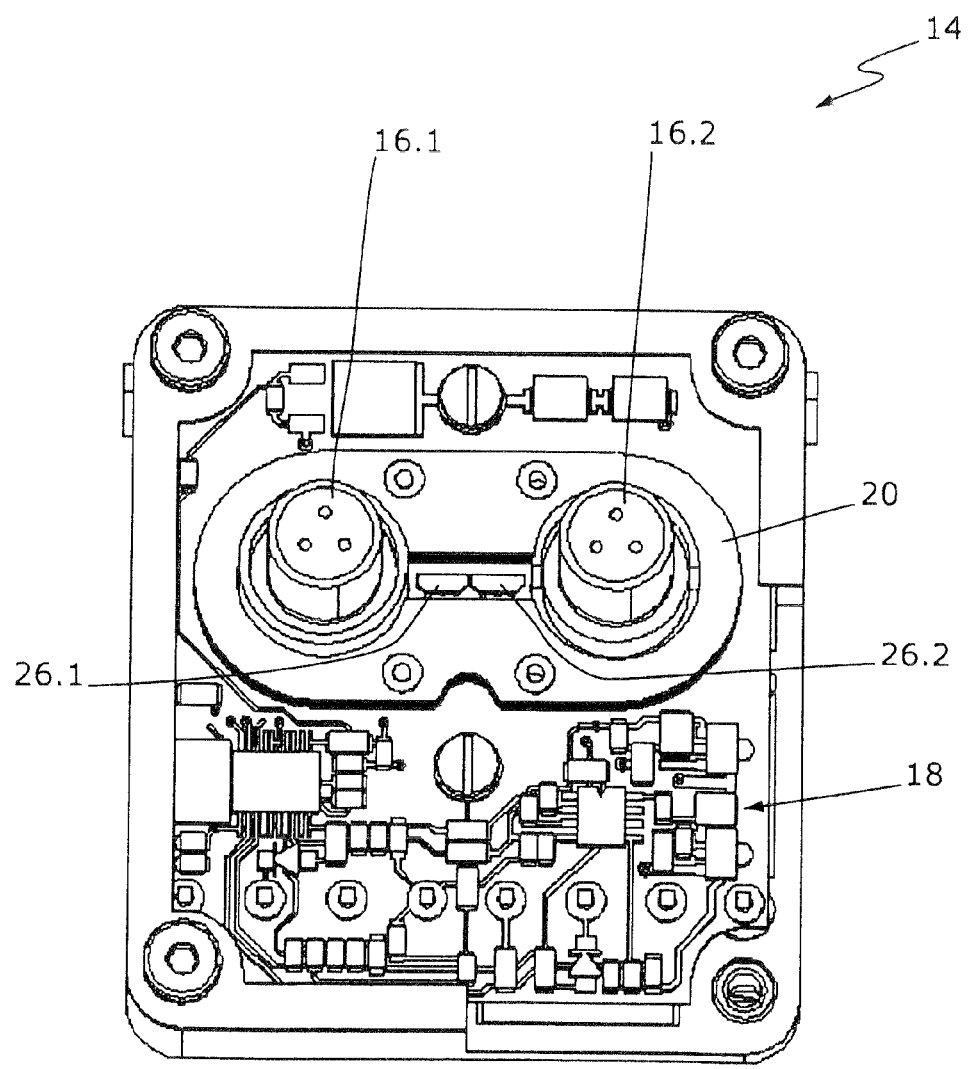
FIG. 2, a perspective view of a connection unit of FIG. 1.

In FIG. 2, the connection unit 14 of the relay 10 is shown in a perspective top view. In this first exemplary embodiment of the invention shown in FIG. 2, the device 20 for aligning the magnetic flux is embodied as a ferromagnetic body, which annularly embraces the two main contact terminals 16.1, 16.2 and which has an inner free space, in which two Hall sensors 26.1, 26.2 are located. If the relay 10 is switched on, a current flows from the main contact terminal 16.1 to the main contact terminal 16.2, or vice versa, depending on the current direction. Both the current flowing into the relay 10 and the current flowing out of the relay 10 induce a magnetic field, which is focused on the Hall sensors 26.1, 26.2 and amplified by the device 20 for aligning the magnetic flux. The Hall sensor 26.1 can be designed for measuring relatively low currents and the Hall sensor 26.2 can be designed for measuring higher currents. More precisely, at each of the Hall sensors 26.1, 26.2, a voltage that corresponds to a current flowing through the relay 10 can be picked up. The voltage picked up at the Hall sensors 26.1, 26.2 is evaluated for that purpose by the microcontroller 18.

If the current flowing through the relay 10 exceeds a defined threshold value, the microcontroller 18 can interrupt the current circuit flowing via the main contact terminals 16.1, 16.2 by means of switching off the relay 10. Brief current peaks—depending on the programming of the microcontroller 18—can be ignored. Moreover, the microcontroller 18 can output the current intensity, measured by the Hall sensors 26.1, 26.2, in analog or digital form.

From a combined look at FIGS. 1 and 2, it becomes clear that the device for aligning the magnetic flux comprises a stack of preferably ferromagnetic metal sheets. The ferromagnetic properties of the device 20 for aligning the magnetic flux make it possible to concentrate the magnetic flux on the Hall sensors 26.1, 26.2. At the same time, by splitting up the device 20 for aligning the magnetic flux into individual sheet-metal layers, low remanence can be attained. A change in the current intensity or current direction of the current flowing through the main contact terminals 16.1, 16.2 can thus be detected quickly and accurately by the Hall sensors 26.1, 26.2.

Figure 3:
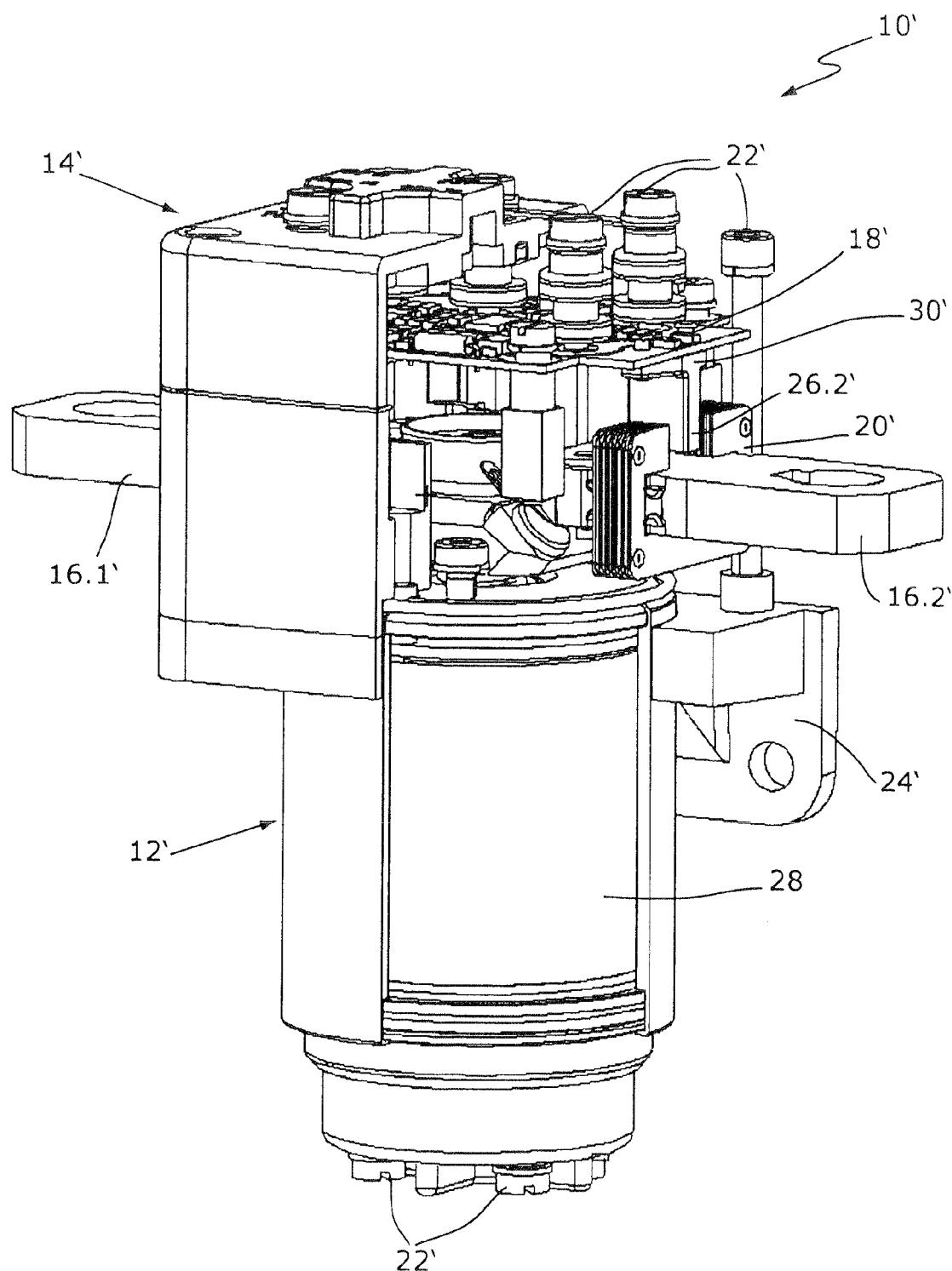
FIG. 3, a perspective view, partly in section, of a second exemplary embodiment of a relay according to the invention.

FIG. 3 shows a further exemplary embodiment of a relay 10' of the invention. The relay 10' includes a base body 12' and a connection unit 14'. In the view, partly in section, of the base body 12', a coil 28 can be seen, which can be embodied for instance in one piece or as an attraction and repulsion coil. The connection unit 14' of the relay 10' of the invention, in the exemplary embodiment shown in FIG. 3, has two main contact terminals 16.1', 16.2', which protrude laterally from the relay 10'. Because of the greater spacing, compared to the first exemplary embodiment, of the main contact terminals 16.1, 16.2, the relay 10' can be used for switching even higher currents. For controlling the relay 10', control contacts 22' are located on its top and bottom sides. Around each of the two main contact terminals 16.1', 16.2' are respective devices 20' for aligning the magnetic flux. As in the exemplary embodiment of FIGS. 1 and 2, the devices 20' for aligning the magnetic flux comprise stacks of ferromagnetic metal sheets. The devices 20' for aligning the magnetic flux have openings on their top side, in which openings Hall sensors 26.1' (not shown in FIG. 3) and 26.2' are located. The Hall sensors 26.1', 26.2' are retained in the opening of the device 20' for aligning the magnetic flux by means of a T-shaped support 30'. As a result, as in the exemplary embodiment described above, the current flowing through the main contact terminals 16.1', 16.2' can be detected galvanically separately. A microcontroller 18' can output the measured current intensity in analog or digital form. At the same time, if the currents are too high or too low, the microcontroller 18' can interrupt the electrical connection between the two main contact terminals 16.1', 16.2' of the relay 10'.

It will be understood that each of the elements described above, or two or more together, may also find a useful application in other types of constructions differing from the types described above.

While the invention has been illustrated and described as embodied in a relay, in particular for the high-current range, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

The invention claimed is:

1. A relay configured to operate in a high-current range, comprising:
   at least one coil;
   a movable armature configured to permit or interrupt a high-current flow via two main contact terminals in accordance with a magnetic flux generated in the at least one coil; and
   a current-measuring instrument for measuring the high-current flow via the two main contact terminals and including a device for aligning the magnetic flux around the main contact terminals;
   wherein the device for aligning the magnetic flux has at least one ferromagnetic body formed as a stack of ferromagnetic sheets surrounding the main contact terminals and provided with an air gap between the two main contact terminals, within which air gap at least one Hall sensor for detecting a magnetic field induced by the high-current flow is located.

2. The relay as defined by claim 1, wherein the device for aligning the magnetic flux has two ferromagnetic bodies and wherein each of the two ferromagnetic bodies embrace one of the two main contact terminals and are provided with an opening in which is located one Hall sensor.

3. The relay as defined by claim 1, wherein the ferromagnetic body annularly embraces both main contact terminals.

4. The relay as defined by claim 1, wherein the current-measuring instrument is configured to measure the high-current flow via the two main contact terminals in both current directions.

5. The relay as defined by claim 1, wherein the current-measuring instrument has a microcontroller for processing signals representative of currents detected and measured by the at least one Hall sensor.

6. The relay as defined by claim 5, wherein the microcontroller converts the signals representative of the detected and measured the high-current flow from analog to digital.

7. The relay as defined by claim 5, further comprising a safety shutoff trippable via the microcontroller.

* * * * *